(12) United States Patent
Nomizu et al.

(10) Patent No.: US 7,371,990 B2
(45) Date of Patent: May 13, 2008

(54) CABLE MONITORING SYSTEM AND MONITORING METHOD THEREOF

(75) Inventors: Seiji Nomizu, Yamato (JP); Masao Furuichi, Atsugi (JP); Shigeru Ohkubo, Tochigi-ken (JP); Masatoshi Tsuchiya, Kawasaki (JP)

(73) Assignees: Nissan Motor Co., Ltd., Yokohama-shi (JP); Dengensha Manufacturing Company Limited, Kawasaki-shi (JP)

( * ) Notice: Subject to any disclaimer, the term of this patent is extended or adjusted under 35 U.S.C. 154(b) by 15 days.

(21) Appl. No.: 11/475,011

(22) Filed: Jun. 27, 2006

(65) Prior Publication Data
US 2006/0289395 A1 Dec. 28, 2006

(30) Foreign Application Priority Data
Jun. 28, 2005 (JP) .............................. 2005-188985

(51) Int. Cl.
*B23K 11/25* (2006.01)
(52) U.S. Cl. ...................................................... 219/109
(58) Field of Classification Search ................ 219/109, 219/130.01, 130.31, 130.32, 130.33
See application file for complete search history.

(56) References Cited

U.S. PATENT DOCUMENTS

| | | | |
|---|---|---|---|
| 3,603,846 A | * | 9/1971 | Toth ....................... 219/130.32 |
| 4,647,751 A | | 3/1987 | Yoshimura et al. |
| 4,803,331 A | | 2/1989 | Cohen |
| 5,262,609 A | * | 11/1993 | Nowak et al. ............... 219/109 |
| 5,637,241 A | | 6/1997 | Moates |

FOREIGN PATENT DOCUMENTS

| | | |
|---|---|---|
| JP | 54-37780 Y2 | 11/1979 |
| JP | 59-159279 A | 9/1984 |
| JP | 7-53822 Y2 | 12/1995 |
| JP | 2001-232481 A | 8/2001 |

* cited by examiner

*Primary Examiner*—Clifford C. Shaw
(74) *Attorney, Agent, or Firm*—Foley & Lardner LLP

(57) ABSTRACT

A cable monitoring system, which monitors failure of a plurality of cables connecting a power supply and a welding gun, has voltage detection lines connected to arbitrary two points of each of the cables, an insulating transformer a primary side of which is connected to the voltage detection lines of each cable, and a failure detector connected to a secondary side of the insulating transformer and detecting failure of each cable based on voltage on the secondary side of the insulating transformer for each cable.

11 Claims, 5 Drawing Sheets

CABLE MONITORING SYSTEM AND MONITORING METHOD THEREOF

BACKGROUND OF THE INVENTION

1. Field of the Invention

The present invention relates to a cable monitoring system capable of monitoring failure (disconnection and degradation) of a plurality of cables connecting a power supply and a welding gun for each cable without performing high voltage measurement and relates to a monitoring method of the same.

2. Description of the Related Art

When a cable supplying welding current to resistance welding equipment is suddenly disconnected while a production line is in operation, the cable needs to be changed after all the production line is shut down. The shutdown generally took a long time and significantly reduced productivity thereof. To prevent such a problem, cable monitoring systems have been invented and utilized.

One of the aforementioned cable monitoring systems monitors variation in impedance due to disconnection and degradation of a secondary conductor of the resistance welding equipment by means of welding current (see Japanese Utility Model Examined Publication No. 54-37780).

In recent years, a welding transformer and a welding gun, which were separated, are integrated and are generally carried as a so-called transgun by a welding robot for spot welding. Such a transgun does not include a long secondary cable connecting the welding transformer and the welding gun. Disconnection therefore occurs in a flexible primary cable which extends from a thyristor of a resistance welding controller provided on a power supply's side to the welding transformer integrated with the welding gun along a robot arm. This primary cable includes, for example, two power lines (cable cores) forming a round-trip electric path, a ground line, and control lines. These lines are coated with an insulating material, The control lines are connected to a servomotor or encoder for pressing the gun, various detectors, a valve for pressing the gun, and the like. The primary cable generally has a diameter of about 20 to 30 mm. This primary cable is repeatedly bent by an action of the robot arm during the operation of the production line and moreover causes self heating because of energization for welding. Copper lines are thus oxidized and thinned causing degradation. Accordingly, the primary cable is easily disconnected.

Furthermore, high voltage of 200 or 400 V from the power supply is directly applied to the primary cable. The voltage applied to the primary cable is high as described above compared to secondary voltage applied to the secondary cable, which is as low as 10 to 20 V. Accordingly, disconnection of the primary cable is more dangerous than that of the secondary cable. In measurement of resistance of the primary cable, to which high voltage is applied, high voltage is applied to a control line and detectors used for the measurement. Touching the control line is therefore dangerous, and the detectors are susceptible to damage.

To prevent disconnection of the primary cable from causing shutdown of the production line for a long time, a monitoring system monitoring failure of the primary cable has been proposed (see Japanese Utility Model Examined Publication No. 7-53822).

However, the monitoring system of the Japanese Utility Model Examined Publication No. 7-53822 has a structure in which, in measurement of the resistance of the primary cable at high voltage which is connected to the primary side of the transformer for resistance welding equipment, resistance between parallel lines of the primary cable is detected and disconnection/degradation is judged. Accordingly, it is impossible to detect resistance of each line and especially a necessary portion of the primary cable. There is a room for improvement in increasing monitoring accuracy. Moreover, this monitoring system is still in a situation where touching the control lines is dangerous and the detectors are susceptible to damage, similar to the monitoring system of the Japanese Utility Model Examined Publication No. 54-37780, since high voltage is applied to the control lines and detectors.

Moreover, as a monitoring system which prevents the aforementioned danger and eliminates the influence on peripheral devices, systems of Japanese Patent Unexamined Publications No. 59-159279 and No. 2001-232481 are disclosed.

SUMMARY OF THE INVENTION

However, the conventional monitoring systems could not detect failure of the primary cable composed of a plurality of cables bounded (a cable which connects the power supply and the welding gun and to which high voltage is applied) for each cable. Furthermore, the conventional monitoring systems could not accurately measure the resistance of a cable itself without high voltage measurement to detect failure (disconnection and degradation) of the cable.

The present invention was made in the light of the aforementioned problems of the conventional technologies. An object of the present invention is to provide a cable monitoring system capable of monitoring failure of a plurality of cables connecting a power supply and a welding gun without high voltage measurement for each cable while the welding gun is being energized.

The first aspect of the present invention provides a cable monitoring system which monitors failure of a plurality of cables connecting a power supply and a welding gun, comprising: voltage detection lines connected to arbitrary two points of each of the cables; an insulating transformer a primary side of which is connected to the voltage detection lines of each cable; and a failure detector connected to a secondary side of the insulating transformer and detecting failure of each cable based on voltage on the secondary side of the insulating transformer for each cable.

The second aspect of the present invention provides a cable monitoring method for monitoring failure of a plurality of cables connecting a power supply and a welding gun attached to a work end of an arm of a multi-axis robot, comprising: detecting a value of voltage between two arbitrary points of each of the cables through an insulating transformer while the welding gun is being energized through the cables; and judging presence of failure of each cable based on the detected value of the voltage.

The third aspect of the present invention provides a cable monitoring system which monitors failure of a plurality of cables connecting a power supply and a welding gun, comprising: voltage detection lines connected to arbitrary two points of each of the cables; an insulating transformer a primary side of which is connected to the voltage detection lines of each cable; and failure detecting means, connected to a secondary side of the insulating transformer, for detecting failure of each cable based on voltage on the secondary side of the insulating transformer for each cable.

BRIEF DESCRIPTION OF THE DRAWINGS

The invention will now be described with reference to the accompanying drawings wherein.

DETAILED DESCRIPTION OF THE PREFERRED EMBODIMENT

Hereinafter, a detailed description is given of embodiments of a cable monitoring system according to the present invention and a monitoring method thereof based on the drawings.

Figure 1:
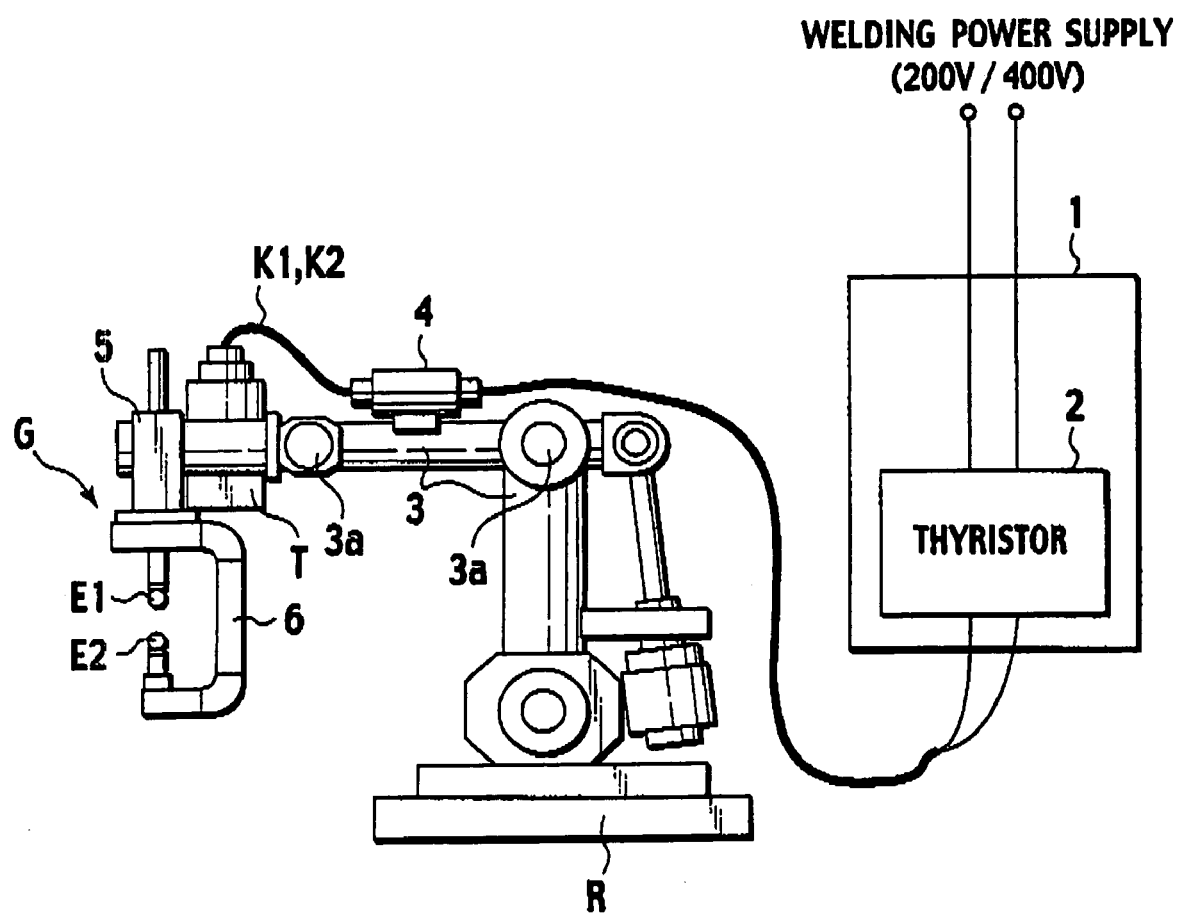
FIG. 1 is a schematic configuration view of resistance spot welding equipment to which a cable monitoring system according to the present invention is applied.

FIG. 1 shows a configuration of resistance spot welding equipment to which a cable monitoring system according to the present invention is applied. The resistance spot welding equipment includes a welding robot R as a multi-axis robot and a resistance welding controller 1. To a working end of an arm 3 of the welding robot R, a welding gun G is attached. The welding gun G is a transgun including a welding transformer T.

The resistance welding controller 1 is connected to a welding power supply which supplies voltage of 200 or 400 V. The resistance welding controller 1 includes a thyristor 2 serving as a switching element. The thyristor 2 controls the magnitude of welding current supplied to the welding robot R.

The welding transformer T of the welding robot R and the thyristor 2 of the resistance welding controller 1 are connected through two primary cables K1 and K2. To the arm 3 of the welding robot R, a relay box 4 is attached. Part of each of the primary cables K1 and K2 is connected to the relay box 4, which allows the primary cables K1 and K2 to be laid along the arm 3 between the welding transformer T and the thyristor 2. In order to prevent damage by high voltage, the relay box 4 includes an insulating transformer which plays a role in isolating a later-described monitoring system from the welding power supply and the primary cables K1 and K2.

The welding gun G includes a C-shaped gun arm 6, to both ends of which a moving electrode E1 and a fixed electrode E2 are individually attached. The welding gun G includes a motor actuator 5, and rotational force of the motor actuator 5 is converted into a linear motion with a ball screw and a ball nut to vertically drive the moving electrode E1. At welding, weld pieces are sandwiched under pressure by the moving and fixed electrodes E1 and E2, and then large current is applied between the both electrodes to weld the weld pieces.

A secondary side of the welding transformer T is directly connected to the moving and fixed electrodes E1 and E2 with conductors interposed therebetween. Accordingly, there is no secondary cable on the secondary side, thus implementing a structure with no secondary cable. The primary cables K1 and K2, to be exact, connect the primary side of the welding transformer T and the secondary side of the thyristor 2.

The resistance welding controller illustrated in FIG. 1 as an example is a single phase AC type. The present invention can be applied to other three phase AC-type resistance welding controller or inverter-type welding controller. Moreover, FIG. 1 shows the C-shaped welding gun as an example, but the present invention can be also applied to an X-shaped gun.

Figure 2:
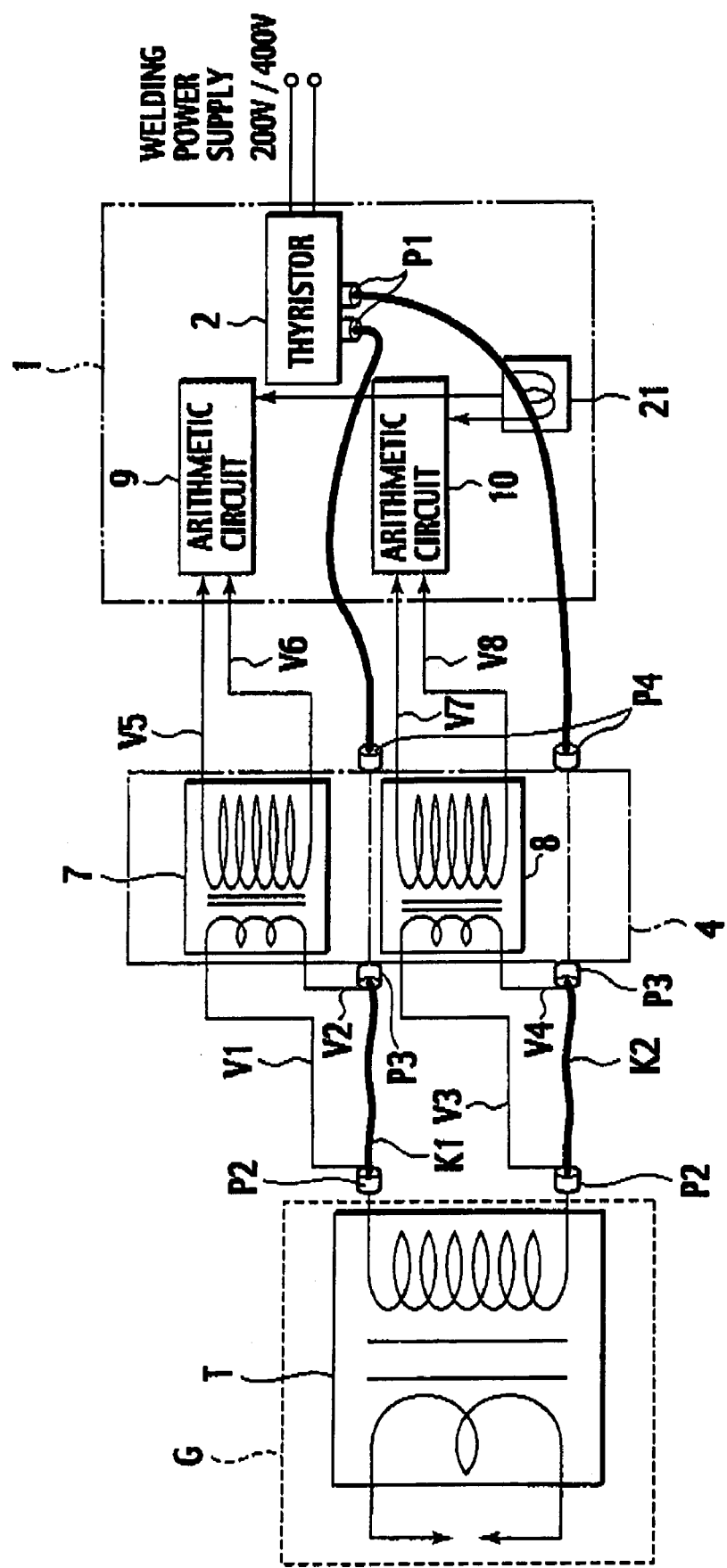
FIG. 2 is a block diagram showing a configuration of the cable monitoring system according to the present invention.

FIG. 2 shows a configuration of the cable monitoring system according to the present invention. The cable monitoring system according to the present invention monitors failure of a plurality of cables connecting the power supply and the welding gun.

As shown in the drawing, the resistance welding controller 1 includes the thyristor 2, a current transformer 21, and two arithmetic circuits 9 and 10. The relay box 4 includes the two insulating transformers 7 and 8, and the welding gun G includes a welding transformer T.

The resistance welding controller 1 includes a function to control the magnitude of the welding current with the thyristor 2 and a function to detect failure including disconnection and degradation of the primary cables K1 and K2 with the two arithmetic circuits 9 and 10. The two arithmetic circuits 9 and 10 are connected to the respective secondary sides of the insulating transformers 7 and 8 and to the current transformer 21. The arithmetic circuits 9 and 10 respectively detect failure of the primary cables K1 and K2 based on voltages on the primary sides of the insulating transformers 7 and 8 which are separately detected for the primary cables K1 and K2 and based on current detected through the current transformer 21. The two arithmetic circuits 9 and 10 thus serve as failure detectors.

The relay box 4 relays the primary cables K1 and K2, which form a pair of positive and negative electric paths connecting the thyristor 2, which is provided for the resistance welding controller 1, and the welding transformer T, which is provided for the welding gun G.

Ends of the primary cables K1 and K2 on the thyristor 2 side are connected to the thyristor 2 through plugs P1, and ends of the primary cables K1 and K2 on the welding transformer T side are connected to the welding transformer T through plugs P2. Moreover, relay portions (portions indicated by dotted lines in the drawing) of the primary cables K1 and K2 located in the relay box 4 are also connected through plugs P3 and P4. Arbitrary two points of the primary cable K1, or two points of the primary cable K1 between the plug P2 of the welding transformer T and the plug P3 provided on the welding transformer T side of the relay box 4, are individually connected to ends of voltage detection lines V1 and V2. Arbitrary two points of the primary cable K2, or two points of the primary cable K2 between the plug P2 of the welding transformer T and the plug P3 provided on the welding transformer T side of the relay box 4, are individually connected to ends of voltage detection lines V3 and V4. The other ends of the voltage detection lines V1 and V2, and V3 and V4 are separated for each of the primary cables K1 and K2 and connected to primary sides of the insulating transformers 7 and 8, respectively. The secondary sides of the insulating transformers 7 and 8 are respectively connected to the arithmetic circuits 9 and 10 through voltage measurement control lines V5 and V6, and V7 and V8. In this embodiment, the primary cables K1 and K2, the welding transformer T, the relay box 4, and the thyristor 2 are connected by means of the plugs but may be connected by means of screw terminals.

The insulating transformers 7 and 8 enable measurement of resistances of the primary cables K1 and K2 respectively, between the plugs P2 of the welding transformer T and the plugs P3 on the welding transformer T side of the relay box 4 while isolating the measurement from high voltage of the primary cables K1 and K2.

Figure 3:
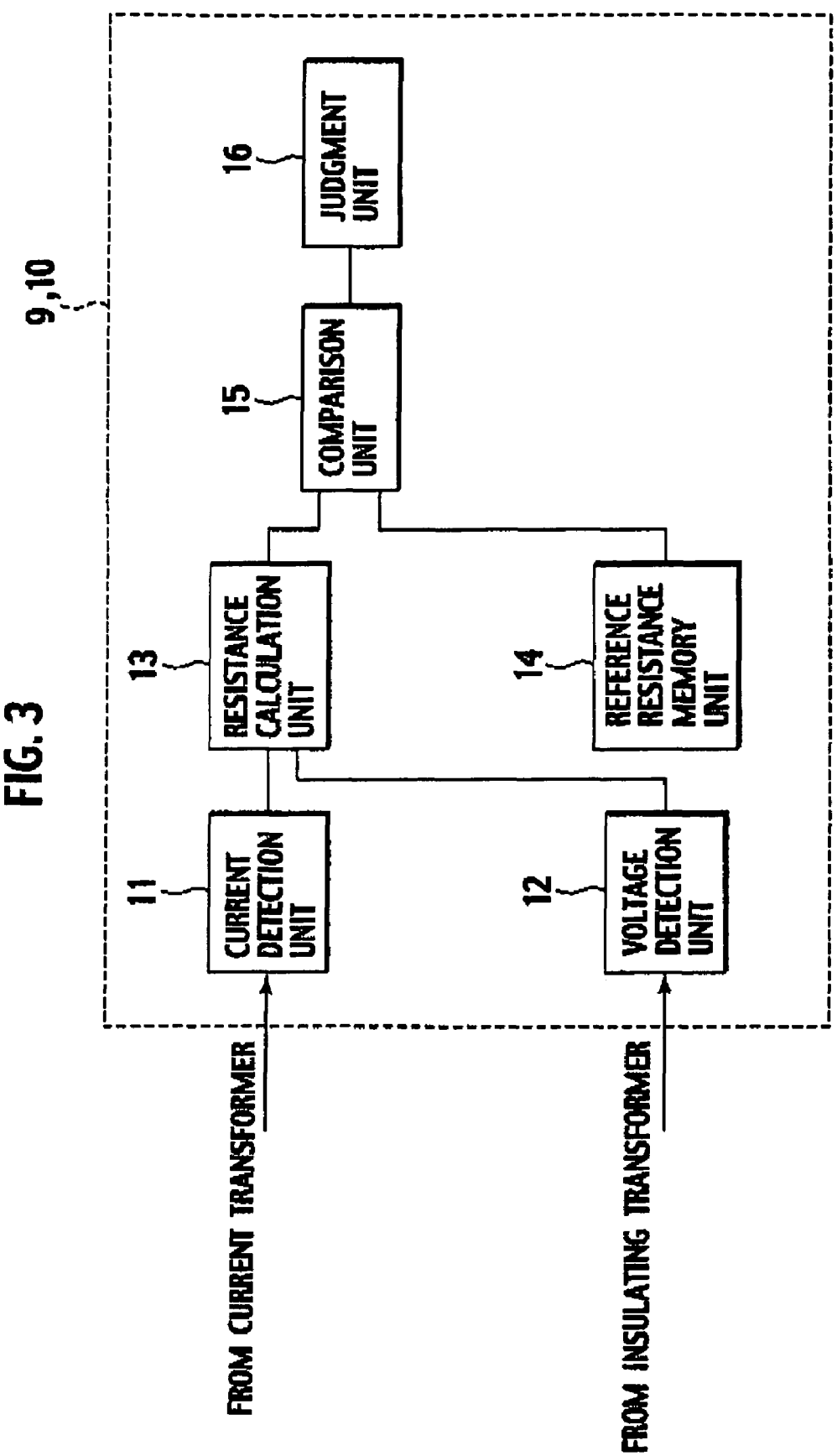
FIG. 3 is a block diagram showing a configuration of an arithmetic circuit provided for a resistance welding controller shown in FIG. 2.

FIG. 3 is a block diagram showing a configuration of each of the arithmetic circuit 9 and 10, which are provided for the resistance welding controller 1 shown in FIG. 2. Each of the arithmetic circuits 9 and 10 includes a current detection unit 11, a voltage detection unit 12, a resistance calculation unit 13, a reference resistance memory unit 14, a comparison unit 15, and a judgment unit 16.

The current detection unit 11 of the arithmetic circuit 9 detects current flowing through the primary cable K1 based on detection signal outputted from the current transformer 21. The current detection unit 11 of the arithmetic circuit 10 detects current flowing through the primary cable K2 based on detection signal outputted from the current transformer 21. The voltage detection unit 12 of the arithmetic circuit 9 detects, with differential amplifier circuit, voltage of the primary cable K1 inputted to the insulating transformer 7 through the voltage detection lines V1 and V2 and outputted through the voltage measurement control lines V5 and V6. The voltage detection unit 12 of the arithmetic circuit 10 detects, with differential amplifier circuit, voltage of the primary cable K2 inputted to the insulating transformer 8 through the voltage detection lines V3 and V4 and outputted through the voltage measurement control lines V7 and V8. Each of the voltage detection units 12 of the arithmetic circuits 9 and 10 removes an induction component of the detected voltage with integrator circuit and adjust the voltage with the induction component removed to optimal voltage with a gain adjustment circuit. The resistance calculation unit 13 of the arithmetic circuit 9 divides the voltage between the arbitrary two points of the primary cable K1, which is detected by the voltage detection unit 12, by the current flowing through the primary cable K1, which is detected by the current detection unit 11, to calculate resistance between the arbitrary two points of the primary cable K1. The resistance calculation unit 13 of the arithmetic circuit 10 divides the voltage between the arbitrary two points of the primary cable K2, which is detected by the voltage detection unit 12, by the current flowing through the primary cable K2, which is detected by the current detection unit 11, to calculate resistance between the arbitrary two points of the primary cable K2. The reference resistance memory unit 14 of the arithmetic circuit 9 stores resistance between the arbitrary two points of the primary cable K1 as reference resistance value when the primary cable K1 is normal. The reference resistance memory unit 14 of the arithmetic circuit 10 stores resistance between the arbitrary two points of the primary cable K2 as reference resistance value when the primary cable K2 is normal. The reference resistance values are set to be slightly lower than respective resistances when the primary cables K1 and K2 are degraded and disconnected. However, how low the reference resistances are set is determined by repeated experiments and tests. The comparison unit 15 of the arithmetic circuit 9 compares the resistance between the arbitrary two points of the primary cable K1, which is calculated by the resistance calculation unit 13, with the reference resistance value of the cable stored in the reference resistance memory unit 14. The comparison unit 15 of the arithmetic circuit 10 compares the resistance between the arbitrary two points of the primary cable K2, which is calculated by the resistance calculation unit 13, with the reference resistance value of the cable stored in the reference resistance memory unit 14. The judgment unit 16 of the arithmetic circuit 9 judges the primary cable K1 to be normal when the resistance between the two arbitrary points of the primary cable K1 is within a predetermined range with respect to the reference resistance value. The judgment unit 16 of the arithmetic circuit 10 judges the primary cable K2 to be normal when the resistance between the two arbitrary points of the primary cable K2 is within a predetermined range with respect to the reference resistance value. When the resistance between the two arbitrary points of the primary cable K1 is not within the predetermined range with respect to the reference resistance value for the primary cable K1, the judgment unit 16 of the arithmetic circuit 9 judges the primary cable K1 to be abnormal and issues a warning. When the resistance between the two arbitrary points of the primary cable K2 is not within the predetermined range with respect to the reference resistance for the primary cable K2, the judgment unit 16 of the arithmetic circuit 10 judges the primary cable K2 to be abnormal and issues a warning. Each of the resistance calculation units 13, the comparison units 15, and the judgment units 16 is composed of a program operating in a CPU.

Figure 4:
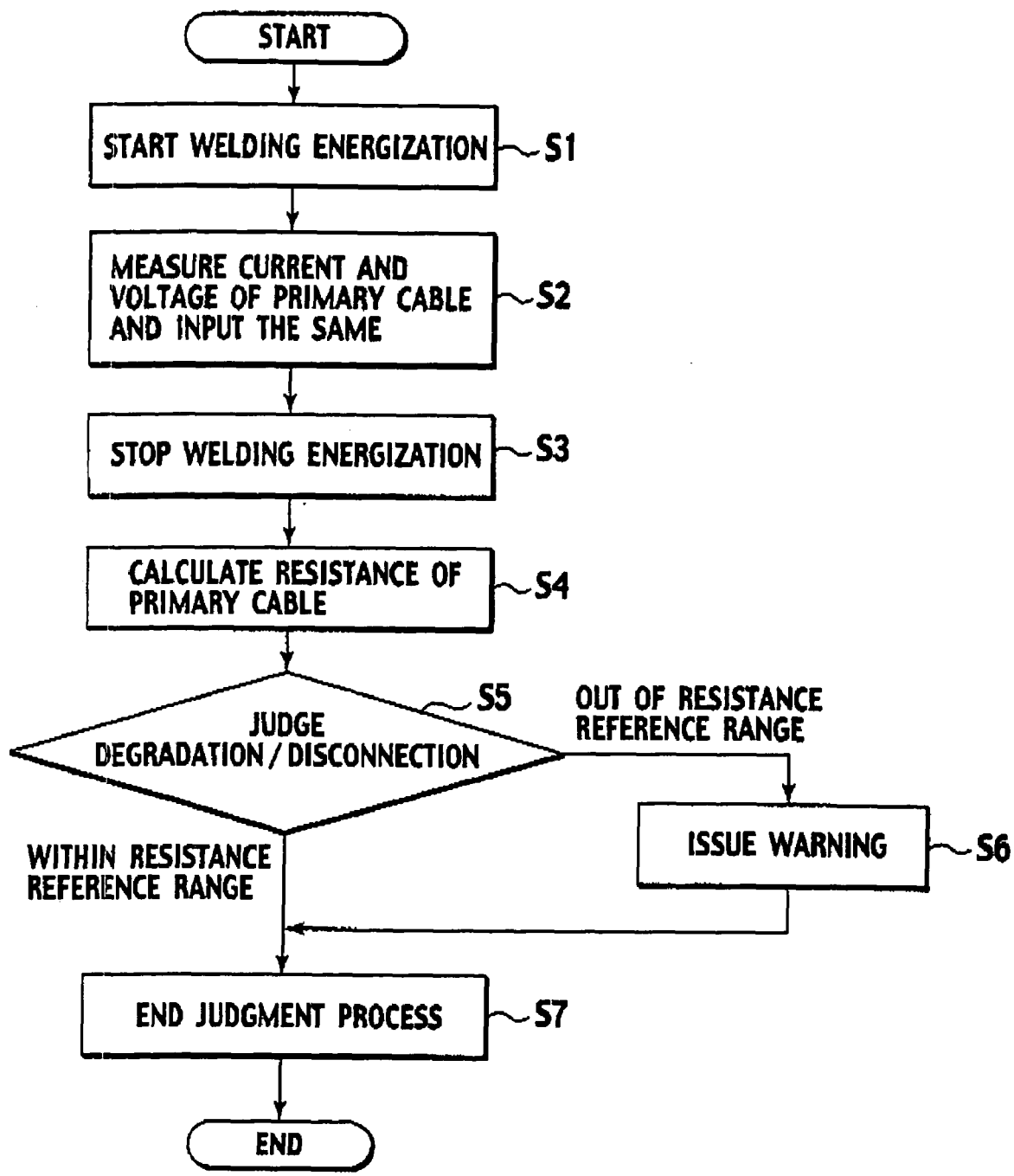
FIG. 4 is a flowchart showing an action of the cable monitoring system according to the present invention.
Figure 5:
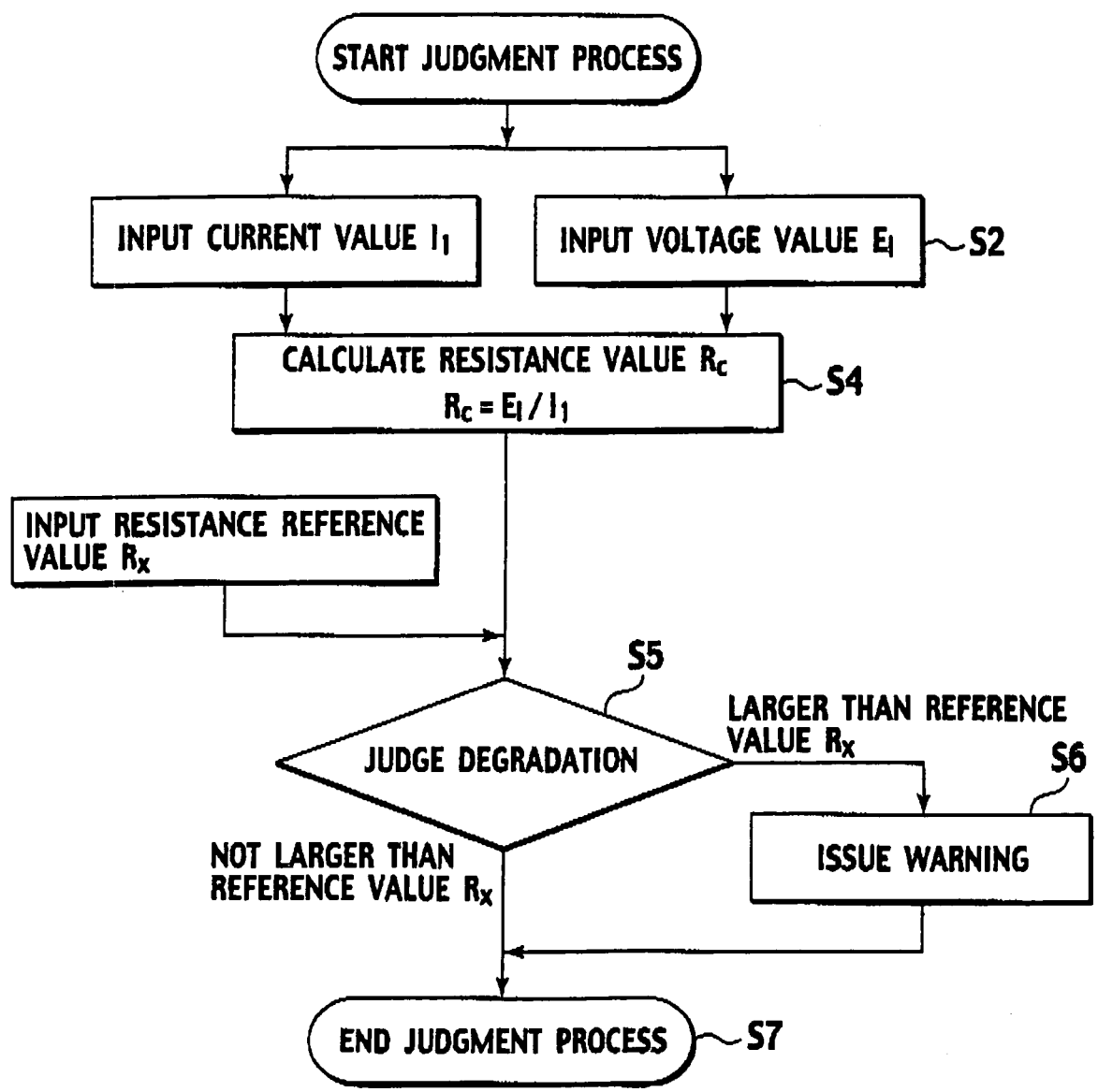
FIG. 5 is a flowchart showing a cable failure judgment process of the cable monitoring system according to the present invention.

The thus structured cable monitoring system operates as follows. FIG. 4 is an operation flowchart of the cable monitoring system according to the present invention, showing B process to judge degradation/disconnection of the primary cables K1 and K2. FIG. 5 is a flowchart of a cable failure judgment process, showing details of steps S4 to S6 of the flowchart of FIG. 4.

(Step S1)

When start of energization for welding is instructed, the resistance spot welding equipment determines pressure of the welding gun G, the magnitude of welding current, and energization time based on work information concerning the weld pieces. In the welding robot R, arm shafts 3a are driven and rotated by a not-shown servomotor to move the arm 3 to a predetermined position. The welding gun G is thus moved to optimal position and orientation necessary for spot welding. When the moving and fixed electrodes E1 and E2 of the welding gun G are set to a welding point, the moving electrode E1 is driven by the motor actuator 5 toward the fixed electrode E2 to sandwich the weld pieces with a predetermined pressure. In this state, the determined magnitude of welding current is allowed to flow between the moving and fixed electrodes E1 and E2 from the resistance welding controller 1 through the primary cables K1 and K2 for the determined energization time. The weld pieces are welded with this welding current.

(Step S2)

In this welding work, while the welding current is flowing through the primary cables K1 and K2, voltage between the voltage detection lines V1 and V2, which are connected to the primary cable K1, is inputted to the voltage detection unit 12 of the arithmetic circuit 9 through the insulating transformer 7 and voltage measurement control lines V5 and V6. Moreover, voltage between the voltage detection lines V3 and V4, which are connected to the primary cable K2, is inputted to the voltage detection unit 12 of the arithmetic circuit 10 through the insulating transformer 8 and voltage measurement control lines V7 and V8. The insulating transformers 7 and 8 reduce the voltages at the primary cables K1 and K2 to voltages suitable for operation in the arithmetic circuits 9 and 10 to protect the arithmetic circuits 9 and 10 from high voltages on the primary cables K1 and K2 sides, respectively. On the other hand, currents flowing through the primary cables K1 and K2 are detected by the current transformer 21, which is provided for the resistance welding controller 1, and inputted to the arithmetic circuits 9 and 10, respectively.

(Step S3)

The resistance welding controller 1 stops supplying the welding current when the energization time has elapsed. During the energization, the welding spot in the weld pieces is heated and melt to form a nugget in predetermined size, thus completing welding of the weld pieces.

(Step S4)

When welding of one welding spot is completed, the moving electrode E1 of the welding gun G is driven by the motor actuator 5 so as to be separated from the fixed electrode E2, and simultaneously, the welding robot R begins positioning of the welding gun 0 for the next welding spot. As shown in FIG. 5, using the following equation (1), the resistance calculation unit 13 of the arithmetic circuit 9 calculates a resistance value $R_c$ between the voltage detection lines V1 and V2 in the primary cable K1 from values $E_i$ and $I_1$ of the detected voltage and current, and the resistance calculation unit 13 of the arithmetic circuit 10 calculates the resistance value $R_c$ between the voltage detection lines V3 and V4 in the primary cable K2 from the values $E_i$ and $I_1$ of the detected voltage and current.

Resistance value $(R_c)$=Detected Voltage Value $(E_i)$/ Detected Current Value $(I_1)$     Equation (1)

(Steps S5 and S6)

The comparison unit 15 of the arithmetic circuit 9 compares the resistance value $R_c$ calculated by the resistance calculation unit 13 with a reference resistance value $R_x$ stored in the reference resistance memory unit 14. Simultaneously, the comparison unit 15 of the arithmetic circuit 10 compares the resistance value $R_c$ calculated by the resistance calculation unit 13 with the reference resistance value $R_x$ stored in the reference resistance memory unit 14. When the judgment unit 16 of the arithmetic circuit 9 or 10 judges as a result of this comparison that the calculated resistance value $R_c$, is larger than the reference resistance value $R_x$ (out of a resistance reference range), the primary cable K1 or K2 is determined to be degraded or disconnected, so that a warning is issued to the outside to make a notification that it is time to change the primary cable K1 or K2. On the other hand, when the judgment unit 16 of the arithmetic circuit 9 or 10 judges as a result of this comparison that the calculated resistance value $R_c$ is not larger than the reference resistance value $R_x$ (within the resistance reference range), the primary cables K1 and K2 need not be changed, and no warning is issued.

(Step S7)

When the processes of the steps S1 to S6 are thus finished, the process to judge degradation/disconnection of the primary cables K1 and K2 is terminated.

The cable monitoring system according to the present invention operates as described above and can monitor degradation/disconnection of the primary cables K1 and K2 at each spot during welding work. Specifically, high voltage is applied to the cables during the welding work, but the insulating transformers can isolate the lines from the insulating transformers to the failure detector and the failure detector itself from the voltage applied to the cables, thus ensuring the safety in monitoring. Furthermore, failure of the cables can be monitored for each cable, thus increasing the accuracy in detecting failure. It is therefore possible to accurately predict disconnection/degradation of the cables while the product line is in operation and increase the operating rate of the product line, Moreover, the welding cable is composed of a number of thin wires integrated to be made flexible. Accordingly, when the arm shafts of the multi-axis robot are rotated to pull and bend the cables in the welding work, even if the thin wires are not disconnected while the welding robot is standing by and not performing welding, the thin wires are stressed, so that some of the lines become likely to be disconnected in some cases. In the present invention, in the light of such circumstances, voltage between arbitrary two points of each cable arranged along the arm of the multi-axis robot is detected through the insulating transformer while the arm of the multi-axis robot is moving and the welding gun is applying welding current to the weld pieces. This allows monitoring while ensuring the safety in the welding work. Moreover, it is possible to monitor failure of the cables pulled along by the robot arm for each cable in a severe situation where the cables are most likely to be disconnected. Accordingly, the accuracy in detecting failure is increased, and disconnection/degradation of cables can be accurately predicted while the production line is in operation, thus increasing the operating rate of the production line.

In the aforementioned embodiment, the insulating transformers are provided within the relay box 4. This is because the insulating transformer can be protected from sputter generated during welding or external force including impact and interference by the primary cables K1 and K2 operating three-dimensionally. Moreover, locating the relay box 4 midway between the welding gun G and the welding controller, for example, at a predetermined position on the robot arm side can minimize the length of the cable portion distal to the relay box 4, which is forced to move most severely. The primary cables K1 and K2, which are consumed and changed, can be therefore shorter, thus allowing cost reduction. Moreover, the primary cables K1 and K2 can adequately respond to multiple movement of the welding gun G, thus extending the lives of the primary cables K1 and K2.

Moreover, the insulating transformer 7 is provided between the voltage detection lines V1 and V2 and the arithmetic circuit 9, and the insulating transformer 8 is provided between the voltage detection lines V3 and V4 and the arithmetic circuit 10 to isolate the secondary sides of the insulating transformers 7 and 8 from high voltage. Accordingly, the voltages inputted to the arithmetic circuits 9 and 10 can be about 5 V. The conventional troubles such that the detectors are influenced and damaged by high voltage can be avoided, and the measurement accuracy can be considerably increased.

In the aforementioned embodiment, degradation and disconnection of the primary cables K1 and K2 are judged based on whether the detected resistance is larger than the reference resistance value $R_x$ but may be judged based on whether the resistance is within a certain range around the reference resistance value $R_x$. Moreover, the judgment of degradation and disconnection of the primary cables K1 and K2 may be performed not for each welding point but for every arbitrary welding points.

The present invention is applicable to cable failure monitoring in a controller controlling welding equipment such as resistance spot welding equipment with a C-type gun, an X-type gun, or the like, projection welding equipment, or seam welding equipment.

The entire content of a Japanese Patent Application No. P2005-188985 with a filing date of Jun. 28, 2005 is herein incorporated by reference.

Although the invention has been described above by reference to certain embodiments of the invention, the invention is not limited to the embodiments described above and modifications may become apparent to these skilled in the art, in light of the teachings herein. The scope of the invention is defined with reference to the following claims.

What is claimed is:

1. A cable monitoring system which monitors failure of a plurality of primary cables connecting a power supply and a welding transformer, a secondary side of which is connected to a welding gun, the cable monitoring system comprising:
    two voltage detection lines for each of the primary cables connected to two arbitrary points of each of the primary cables;
    an insulating transformer for each of the primary cables, a primary side of which is connected to the voltage detection lines of each primary cable; and
    a failure detector connected to a secondary side of each insulating transformer and detecting failure of each primary cable based on voltage on the secondary side of the respective insulating transformer for each primary cable.

2. A cable monitoring system according to claim 1, wherein the insulating transformer sets voltage on the secondary side to voltage lower than voltage on the primary side to isolate the failure detector from the power supply at high voltage.

3. A cable monitoring system according to claim 1, wherein the failure detector comprises:
    a current detection unit configured to detect a value of current flowing through each primary cable;
    a voltage detection unit configured to detect a value of voltage on the secondary side of the respective insulating transformer;
    a resistance calculation unit configured to calculate a resistance value between the arbitrary two points of each primary cable from the detected values of the current and voltage;
    a reference resistance memory unit configured to store a normal value of the resistance between the arbitrary two points of each primary cable as a reference resistance value;
    a comparison unit configured to compare the resistance value with the reference resistance value; and
    a judgment unit configured to judge the primary cable to be normal when the resistance value between the arbitrary two points of each primary cable is within a predetermined range with respect to the reference resistance value and to judge the primary cable to be abnormal when the resistance value between the arbitrary two points of each primary cable is not within the predetermined range.

4. A cable monitoring system according to claim 1, wherein a welding controller configured to control welding current is provided between the power supply and the welding gun,
    wherein the welding gun incorporates a welding transformer,
    wherein a plurality of the primary cables connect a secondary side of a switching element provided for the welding controller and a primary side of the welding transformer, and
    wherein the failure detector is incorporated in the welding controller.

5. A cable monitoring system according to claim 1,
    wherein the welding gun is attached to a working end of a robot, and
    the insulating transformers are incorporated in a relay box which is placed on an arm of the robot and is connected to the primary cables.

6. A cable monitoring system according to claim 1,
    wherein the welding gun includes a moving electrode driven by a motor actuator.

7. A cable monitoring method for monitoring failure of a plurality of cables connecting a power supply and a welding gun attached to a work end of an arm of a multi-axis robot, comprising:
    detecting a value of voltage between two arbitrary points of each of the cables through an insulating transformer while the welding gun is being energized through the cables; and
    judging presence of failure of each cable based on the detected value of the voltage.

8. A cable monitoring method according to claim 7,
    wherein the value of the voltage is detected while the welding gun is being energized for welding after an arm shaft of the multi-axis robot rotates to move the arm to a predetermined position.

9. A cable monitoring method according to claim 7,
    wherein the judging further comprises:
    calculating a resistance value between the arbitrary two points of each cable from the detected value of the voltage and a value of current of each cable;
    comparing the resistance value with a reference resistance value of each cable previously stored; and
    judging the cable to be normal when the calculated resistance value is within a predetermined range with respect to the reference resistance value and judging the cable to be abnormal when the calculated resistance value is not within the predetermined range.

10. A cable monitoring method according to claim 7,
    wherein the insulating transformer is incorporated in a relay box which is placed on an arm of the robot and is connected to the cables.

11. A cable monitoring system which monitors failure of a plurality of primary cables connecting a power supply and a welding transformer, a secondary side of which is connected to a welding gun, the cable monitoring system comprising:
    two voltage detection lines for each of the primary cables connected to two arbitrary points of each of the primary cables;
    an insulating transformer for each of the primary cables, a primary side of which is connected to the voltage detection lines of each primary cable; and
    failure detecting means, connected to a secondary side of each insulating transformer, for detecting failure of each primary cable based on voltage on the secondary side of the respective insulating transformer for each primary cable.

* * * * *